(12) United States Patent
Akimoto

(10) Patent No.: US 8,263,858 B2
(45) Date of Patent: Sep. 11, 2012

(54) SOLAR CELL ELECTRODE

(75) Inventor: Hideki Akimoto, Kawaskaki Kanagawa (JP)

(73) Assignee: E I du Pont de Nemours and Company, Wilmington, DE (US)

( * ) Notice: Subject to any disclaimer, the term of this patent is extended or adjusted under 35 U.S.C. 154(b) by 282 days.

(21) Appl. No.: 12/754,655

(22) Filed: Apr. 6, 2010

(65) Prior Publication Data
US 2010/0258182 A1    Oct. 14, 2010

Related U.S. Application Data

(60) Provisional application No. 61/167,636, filed on Apr. 8, 2009.

(51) Int. Cl.
*H01B 1/16* (2006.01)
*B05D 5/12* (2006.01)
*H01L 35/14* (2006.01)
*H01L 31/0224* (2006.01)

(52) U.S. Cl. ............ 136/256; 427/74; 252/514

(58) Field of Classification Search ........ 427/96.1, 427/74; 252/514; 136/252–256
See application file for complete search history.

(56) References Cited

U.S. PATENT DOCUMENTS

| 4,486,232 | A  * | 12/1984 | Nakatani et al. ........ 75/252 |
| 7,435,361 | B2 * | 10/2008 | Carroll et al. ........ 252/514 |
| 7,959,831 | B2 * | 6/2011 | Akimoto ........ 252/514 |
| 7,976,735 | B2 * | 7/2011 | Akimoto ........ 252/514 |
| 8,134,068 | B2 * | 3/2012 | Akimoto ........ 136/256 |
| 8,138,415 | B2 * | 3/2012 | Akimoto ........ 136/256 |
| 2008/0230119 | A1 | 9/2008 | Akimoto |
| 2009/0056798 | A1 * | 3/2009 | Merchant et al. ........ 136/256 |

FOREIGN PATENT DOCUMENTS

| JP | 59-011687 A | 1/1984 |
| JP | 2001-307549 A | 11/2001 |
| JP | 2002-141520 | 5/2002 |
| JP | 2003-152200 | 5/2003 |
| JP | 2005-243500 A | 9/2005 |
| JP | 2006-093433 | 4/2006 |
| WO | 2009/108675 A1 | 9/2009 |

OTHER PUBLICATIONS

International Search Report for International Application No. PCT/US/2010/030069 Dated Jun. 24, 2010.

* cited by examiner

*Primary Examiner* — Mark Kopec

(57) ABSTRACT

This invention relates to an electrode used in a solar cell that exhibits good conductivity at the N layer and P layer and to a conductive paste used for producing such an electrode.

4 Claims, 8 Drawing Sheets

$R_{(measure)} = 2 \times R_{(contact)} + R_{(Si\,Wafer)}$ $R_{(Si\,Wafer)} = $ Constant

SOLAR CELL ELECTRODE

BACKGROUND OF THE INVENTION

1. Field of the Invention

This invention relates to an electrode used in a solar cell.

2. Technical Background

Since an electrode for silicon solar cell is required to have low electrical resistance to facilitate improved efficiency. The problem is that Silver which has lower resistance gets high contact resistance on the contact with silicon substrate. To solve the problem, JP2006-93433 discloses an electrode which is formed on a p-type conductive layer by using a conductive paste which comprises silver powder, an organic vehicle, glass frit and at least one kind selected among boron powder, an inorganic boron compound, and an organic boron compound.

JP2003-152200 discloses a conductive paste for a solar cell electrode comprising Ag and $TiO_2$. JPS59-11687 discloses a conductive paste for a solar cell electrode comprising Ag and Ti. JP2002-141520 discloses an electrode for a solar cell comprising inorganic compounds of Ti, Co or Zn. However, even though these electrodes are capable of lowering the contact resistance of the N layer in semiconductors composed of solar cell semiconductor N and P layers, the resistance of the P layer naturally remains high. US 2008/0230119 disclose an electrode comprising Ag and Pd, which is capable of bringing about low contact resistance in both the n-layer and p-layer. However, when the conductive paste is sintered at elevated temperature, the resistance ends up increasing. In view of the above problems, there is a need to provide an electrode for a solar cell, which provides good conductivity in both the N layer and P layer, and does not limit the sintering temperature for sintering the electrode.

BRIEF SUMMARY OF THE INVENTION

The present invention is a solar cell electrode formed by sintering a conductive paste comprises (a) a conductive powder containing silver particles, Ti particles, or $TiH_2$ particles, as well as (i) metal particles selected from the group consisting of Zr, Cr, Co, Mo, Tc, Ru, Rh, Pd, W, Re, Os, Ir, and Pt, (ii) alloy particles including said metals, or (iii) support particles supporting said metal particles; (b) glass frit; and (c) a resin binder. Preferably the conductive powder contains 30 to 98 wt % silver particles, 1 to 70 wt % Ti particles or $TiH_2$ particles, and 1 to 10 wt % (i) metal particles selected from the group consisting of Zr, Cr, Co, Mo, Tc, Ru, Rh, Pd, W, Re, Os, Ir, and Pt, (ii) alloy particles including said metals, or (iii) support particles supporting said metal particles.

In another aspect of this present invention, a method for producing a solar cell electrode comprises a step of applying onto a silicon substrate a conductive paste for a solar cell electrode containing (a) a conductive powder containing silver particles, Ti particles, or $TiH_2$ particles, as well as (i) metal particles selected from the group consisting of Zr, Cr, Co, Mo, Tc, Ru, Rh, Pd, W, Re, Os, Ir, and Pt, (ii) alloy particles including said metals, or (iii) support particles supporting said metal particles, (b) glass frit, and (c) a resin binder; and a step of sintering the conductive paste that has been applied onto the silicon substrate. Preferably the paste is sintered at 450 to 900 degrees Celsius.

In another aspect of this present invention, a method for producing an electrode comprises steps of applying and sintering on both the n-layer and p-layer of a silicon substrate a conductive paste for a solar cell electrode containing (a) a conductive powder containing silver particles, Ti particles, or $TiH_2$ particles, as well as (i) metal particles selected from the group consisting of Zr, Cr, Co, Mo, Tc, Ru, Rh, Pd, W, Re, Os, Ir and Pt, (ii) alloy particles including said metals, or (iii) support particles supporting said metal particles, (b) glass frit, and (c) a resin binder.

The electrode of the present invention can be used to obtain low contact resistance on the P layer as well as the N layer of solar cell semiconductor layers. The electrode resistance is also prevented from increasing when sintered at elevated temperatures.

BRIEF DESCRIPTION OF THE DRAWINGS

FIG. 8A is drawings for the shape of a sample for measuring the contact resistance of electrodes produced on an Si substrate using the electrically conductive paste of the present invention, while

DETAILED DESCRIPTION OF THE INVENTION

Figure 1A:
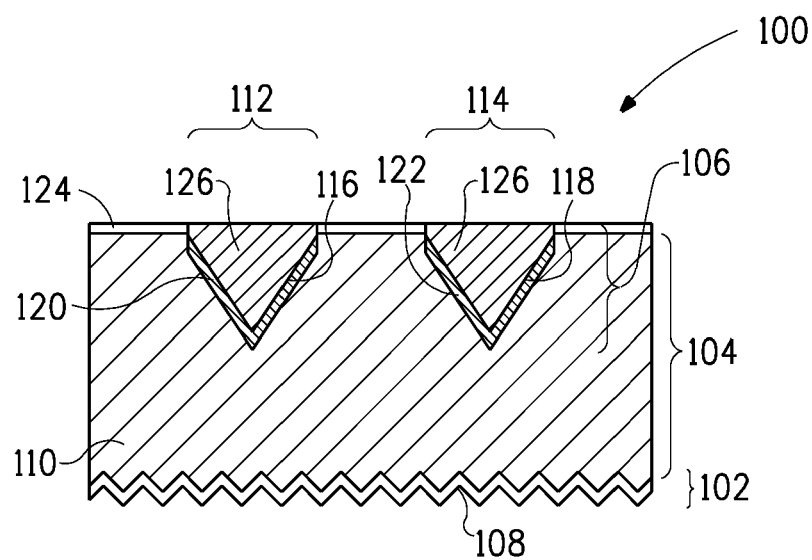
FIG. 1A is a cross-sectional schematic drawing of a portion of a solar cell as claimed in the present invention.

A first embodiment of the present invention relates to an electrode for a silicon solar cell. The electrode of this invention is explained in detail in the following paragraphs.

1. Conductive Powders

Silver Particle:

Silver (Ag) particles are used as an electrically conductive metal. The silver particle may be in the shape of flakes, spheres or they may be amorphous. Although there are no particular limitations on the particle diameter of the silver particle from the viewpoint of technical effects in the case of being used as an ordinary electrically conductive paste, particle diameter has an effect on the sintering characteristics of the silver, for example, silver particle having a large particle diameter are sintered at a slower rate than silver particle having a small particle diameter. Thus, the particle diameter ($d_{50}$, determined with a laser scattering-type particle size distribution measuring apparatus) is preferably within the range of 0.1-20.0 μm, more preferably 2.0-10.0 μm. The particle diameter of the silver particle actually used is determined according to the firing profile. Moreover, it is necessary that the silver particle has a particle diameter suited for methods for applying an electrically conductive paste (for example, screen printing). In the present invention, two or more types of silver particle having different particle diameters may be used as a mixture.

Normally, the silver preferably has a high purity greater than 98%. However, substances of lower purity can be used depending on the electrical requirements of the electrode pattern.

Although there are no particular limitations on the silver content provided it is an amount that allows the object of the present invention to be achieved, in the case of silver particle, the silver content is preferably 30-98 wt %, more preferably 50-90 wt % of the total weight of conductive powder. In the present invention, two or more types of silver particle having different particle diameters and/or different shapes may be used as a mixture.

Titanium Particle:

The solar cell electrode of the present invention includes Ti (Titanium) particles or $TiH_2$ (titanium hydride) particles. The Ti particle or $TiH_2$ particle may be in the shape of flakes, spheres or amorphous form. Although there are no particular limitations on the particle diameter of the Ti or $TiH_2$ particle from the viewpoint of technical effects in the case of being used as an ordinary electrically conductive paste, The average particle size (D50, determined with a laser scattering-type particle size distribution measuring apparatus) of the Ti particles or $TiH_2$ particles is preferably 0.1-100 μm, more preferably 1-60 μm, and even more preferably 3-40 μm. 0.1 μm or less may result in the oxidation of the Ti particles and thus titanium oxide, preventing adequate effects from being achieved by the addition thereof. Although the purity of the Ti particles used in the invention is not particularly limited, the purity is preferably at least 99%. The Ti particle or $TiH_2$ particle content is preferably 1.0-70.0 wt % relative to the total weight of the conductive powder. The minimum content of the particle is more preferably 5 wt %, 15 wt % is even more preferable in order to obtain lower contact resistance. When both Ti particles and $TiH_2$ particles are used, the total content of the Ti particles and $TiH_2$ particles is preferably 1.0-70.0 wt % relative to the total weight of the conductive power. The minimum content of the particle is more preferably 5 wt %, 15 wt % is even more preferable in order to obtain lower contact resistance. Less than 1.0 wt % may result in insufficiently reduced contact resistance with the wafer. A content more than 70.0 wt % may result in higher resistance of the electrode itself. Good electrical properties can be obtained whether Ti particles or $TiH_2$ particles are used alone or in combination, but since $TiH_2$ particles have better oxidation resistance than Ti particles, the use of $TiH_2$ particles is preferred. In the present invention, two or more types of Ti or $TiH_2$ particle having different particle diameters may be used as a mixture.

Other Metal Particles:

In the present invention, Metal Particles other than said Ag, Ti, $TiH_2$ particles are added to the silver and titanium particles as conductive powder. The metal particles are defined as 3d or 4d transition metals belonging to groups 6 to 11 of the periodic table, Namely, the metal particles selected from the group consisting of Zr (zirconium), Cr (Chromium), Co (Cobalt), Mo (molybdenum), Tc (technetium), Ru (ruthenium), Rh (rhodium), Pd (palladium), W (tungsten), Re (rhenium), Os (osmium), Ir (iridium) and Pt (platinum) are added. The groups of metal particles preferably include Zr, Co, Mo, Ru, Rh, Pd, W, and Pt, and more preferably Ru, Pd, and Pt, which can form compounds with the silicon (silicides) present on the wafer when sintered. The addition of these metal particles in the form of a conductive powder allows the contact resistance to be consistently kept low without adjusting the sintering temperature, even when the conductive material is applied onto the p-layer as well as onto the n-layer.

In the present invention, alloy particles containing the above-mentioned Metal particles or particles loaded with the above-mentioned Metal particles can also be used preferably. Examples of alloys containing the metal (also referred to as added particles in the present description) include Ag/Pd alloy, Pd/Au alloy, Pd/Ru alloy, Pd/Pt alloy, Ti/Mo alloy, Ti/Ni alloy, Al/Mo alloy, Ni/Mo alloy, Fe/Co alloy, Ag/W alloy, and Cu/W alloy.

The metal particles may be in the shape of flakes, spheres or amorphous form. Although there are no particular limitations on the particle diameter of the added particles from the viewpoint of technical effects in the case of being used as an ordinary electrically conductive paste, particle diameter has an effect on the sintering characteristics of the silver. For example, the other metal particles having a large diameter are sintered at a slower rate than silver particle having a small particle diameter. Thus, although the particle diameter (D50, determined with a laser scattering-type particle size distribution measuring apparatus) is preferably within the range of 0.1 to 10.0 μm, the particle diameter of the added particles actually used is determined according to the firing profile. Moreover, it is necessary that the added particles has a particle diameter suited for methods for applying a conductive paste (for example, screen printing).

In the present invention, the above-mentioned other metal particles supported by any kind of particles which is conductive can also be used preferably. Since metal particles with small diameter have strong cohesion, the amount of metal particles can be reduced by being supported by the particles which has relatively large diameter. Inexpensive carbon particles or alumina particles ($Al_2O_3$) can be used, for example, as the particles supporting the other metal. More specifically, the carbon particles used in this invention are a carbon which is made from organic precursor heat-treated in the inert atmosphere, for example, Ketchen black, carbon black, activated carbon, coke, graphite. The particle diameter ($D_{50}$) of the carbon particles is preferably within the range of 1.0-10.0 μm. The particle diameter ($D_{50}$) of the metal particles supported by the carbon particles is preferably within the range of 0.01-0.2 μm. The content of the metal particles is preferably within the range of 1-10 wt % based on the total weight of the carbon particles.

The amount of the metal particles is in the range of 1 to 5 wt % by weight based on the total weight of conductive powder. If the amount of added particles is excessively low, effects are not obtained. In addition, if the amount of added particles is excessively high, conductor resistance increases, sinterability decreases and costs increase.

As noted above, the metal particles are ideally Ru, Pd, and Pt, but these metals are expensive. Ag powder which has conventionally been used primarily as conductive powder is also expensive. The present invention allows the costs of the electrode materials to be reduced because Ti particles or $TiH_2$ particles, which are less expensive, are added in order to control the content of such expensive Ag powder and metal particles.

2. Glass Frit

The electrically conductive paste preferably contains an inorganic binder in the form of glass frit. Since the chemical composition of the glass frit is not important in the present invention, any glass frit can be used provided it is a glass frit used in electrically conductive pastes for electronic materials. For example, lead borosilicate glass is used preferably. Lead borosilicate glass is a superior material in the present invention from the standpoint of both the range of the softening point and glass adhesion. In addition, lead-free glass, such as a bismuth silicate lead-free glass, can also be used. Glass frit has a softening point of 350-600 degrees Celsius.

Although there are no particular limitations on the content of the inorganic binder in the form of the glass frit provided, it is an amount that allows the object of the present invention to be achieved. It is preferably 0.5-20.0% by weight and more preferably 1.0-15.0% by weight based on the weight of the paste. If the amount of the inorganic binder is less than 0.5% by weight, adhesive strength may become inadequate. If the amount of the inorganic binder exceeds 15.0% by weight, problems may be caused in the subsequent soldering step due to floating glass and so on. In addition, the resistance value as a conductor also increases.

3. Resin Binder

The electrically conductive paste to make the electrode of the present invention contains a resin binder. In the present invention, any arbitrary resin binder can be used. As a kind of organic resin, for example, an epoxy resin, Polyester resin, an ethylene-vinyl acetate copolymer, and modified cellulose, such as a polyvinyl chloride acetate copolymer, phenol resin, an acrylic resin, a ethyl cellulose, a nitrocellulose, is mentioned. The ethyl cellulose with a good solvent solubility is preferably used in this present invention. The content of the resin binder is preferably 10-50% by weight based on the weight of the paste.

4. Solvent

In the present invention, a solvent can be additionally used as a viscosity adjuster as necessary. Any arbitrary solvent can be used. Examples of the solvent include aromatic, ketone, ester, ether, glycol, glycol ether and glycol ester. In case of screen printing is taken, high-boiling solvent such as ethyl carbitol acetate, butyl cellosolve acetate, cyclohexanone, benzyl alcohol, terpineol are favorably used.

5. Additives

A thickener and/or stabilizer and/or other typical additives may be or may not be added to the electrically conductive paste to make the electrode of the present invention. Examples of other typical additives that can be added include dispersants and viscosity adjusters. The amount of additive is determined dependent upon the characteristics of the ultimately required electrically conductive paste. The amount of additive can be suitably determined by a person with ordinary skill in the art. Furthermore, a plurality of types of additives may also be added. As is explained below, the electrically conductive paste of the present invention has a viscosity within a predetermined range. A viscosity adjuster can be added as necessary to impart a suitable viscosity to the electrically conductive paste. Although the amount of viscosity adjuster added changes dependent upon the viscosity of the ultimate electrically conductive paste, it can be suitably determined by a person with ordinary skill in the art.

Manufacture of Electrode with Conductive Paste:

The following provides an explanation of manufacturing an electrode using the electrode paste. The electrically conductive paste to make the electrode of the present invention can be produced by mixing each of the above-mentioned components with a roll mixing mill or rotary mixer and the like. Although the electrically conductive paste of the present invention is preferably printed onto the Si wafer of a solar cell by screen printing, in the case of being printed by this type of printing, the paste preferably has a predetermined viscosity range. The viscosity of the electrically conductive paste is preferably 50 to 350 Pa·S in the case of using a #14 spindle with a Brookfield HBT viscometer and measuring using a utility cup at 10 rpm and 25° C. Although the amount of viscosity adjuster added changes dependent upon the viscosity of the ultimate electrically conductive paste, it can be suitably determined by a person with ordinary skill in the art. The screen printed paste is dried for 3 to 10 minutes under around 150° C. The dried paste is sintered at temperature of 450 to 900° C., preferably 500° C. to 800° C., for 10 to 60 seconds. Sintering at a temperature lower than 900° C. offers the advantages of reducing damage to P-N junctions, decreasing susceptibility to the occurrence of destruction caused by thermal damage and lowering costs.

Manufacture of Back Contact-Type of PV:

In an embodiment, the electrode of the present invention can be used in a back contact-type of solar cell having both an N layer and P layer on the reverse side. The following provides an explanation of a back contact-type solar cell and an explanation of a production process of back contact-type solar cell electrodes as an example of the present invention, as shown in FIG. 1, while also providing an explanation of an example of the fabrication of a solar cell.

Figure 1B:
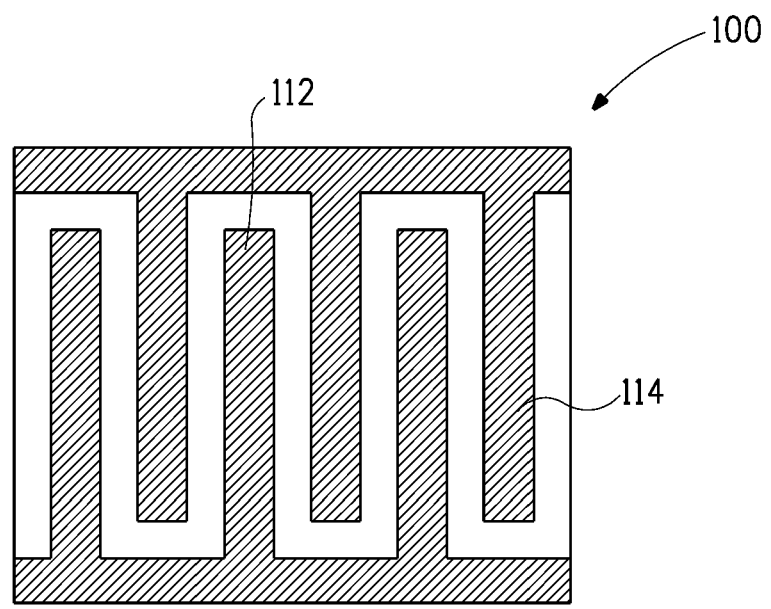
FIG. 1B is an overhead view showing an electrode pattern on a side opposite from a light receiving side in a portion of a solar cell as claimed in the present invention.

FIG. 1A is a cross-sectional drawing of a portion of a back contact-type solar cell, while FIG. 1B is an overhead view showing a portion an electrode pattern on the opposite side from the light receiving side. A back contact-type solar cell 100 is composed of a light receiving section 102, a carrier generating section 104 and an electrode section 106. The light receiving section 102 has a textured structure, and the surface thereof is covered with a anti-reflective film 108. The anti-reflective film 108 is a thin film composed of, for example, titanium dioxide (TiO2) and silicon dioxide (SiO2). As a result of the light receiving section 102 having a textured structure covered by this anti-reflective film 108, more incident light enters the carrier generating section 104, thereby making it possible to increase the conversion efficiency of the solar cell 100.

The carrier generating section 104 is composed of a semiconductor 110. When light from the light receiving section 102 (and particularly light having energy equal to or greater than the band gap of the semiconductor 110) enters this semiconductor 110, valence band electrons are excited to the conduction band, free electrons are generated in the conduction band, and free holes are generated in the valence band. These free electrons and free holes are referred to as carriers. If these carriers reach the electrode section 106 by diffusion prior to being recombined in the carrier generating section 104, a current can be obtained from the electrode section 106. Thus, in order to increase the conversion efficiency of the solar cell 100, it is preferable to use a semiconductor that impairs carrier recombination (namely, has a long carrier life). For this reason, the semiconductor 110 used in the carrier generating section 104 is preferably, for example, crystalline silicon.

The electrode section 106 is a section where current generated in the carrier generating section 104 is obtained. This electrode section 106 is formed on the opposite side from the side of the light receiving section 102 of the semiconductor 110. The electrode section 106 has an anode 112 and a cathode 114, and these are alternately formed on the opposite side from the side of the light receiving section 102 of the semiconductor 110. The anode and the cathode are respectively formed in the form of V grooves 116 and 118 having triangular cross-sections. p-layer 120 is formed in the V groove 116 of the anode, while an n-layer 122 is formed in the V groove 118 of the cathode. The surface of the side opposite from the side of the light receiving section 102 is covered with an oxide film 124. In addition, electrodes 126 formed from the electrically conductive paste are embedded in the V grooves.

Next, an explanation is provided of the production process of the back contact-type solar cell electrodes of the present invention along with an explanation of the production process of a back contact-type solar cell with reference to FIGS. 2 to 5.

First, an explanation is provided of the production a back contact-type solar cell substrate used to produce back contact-type solar cell electrodes with reference to FIGS. 2 to 5.

Figure 2A:
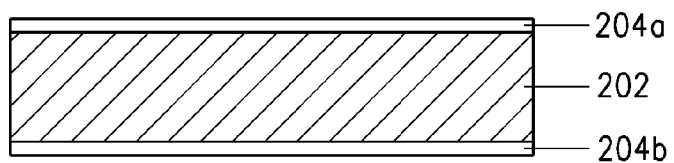
FIG. 2A to 2E are drawings for explaining a production process when producing a solar cell.
Figure 2B:
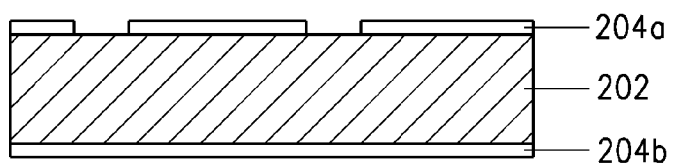

A silicon substrate 202 is prepared, and oxide films 204a and 204b are formed on both sides thereof (FIG. 2A). These oxide films can be formed by, for example, thermal oxidation. Next, the oxide film 204a on one side of the silicon substrate is removed by photolithography or laser etching and so on to leave stripes of a predetermined width (for example, width of 100 μm and interval of 300 μm) (FIG. 2B).

Figure 2C:
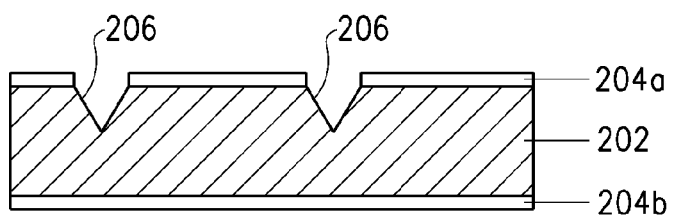

Next, anisotropic etching is carried out with potassium hydroxide (KOH) or tetramethyl ammonium hydroxide (TMAH) on the side from which a portion of the oxide film has been removed, to form V grooves 206 (at an interval of, for example, 300 μm) in the form of stripes having a triangular cross-section (FIG. 2C).

Figure 2D:
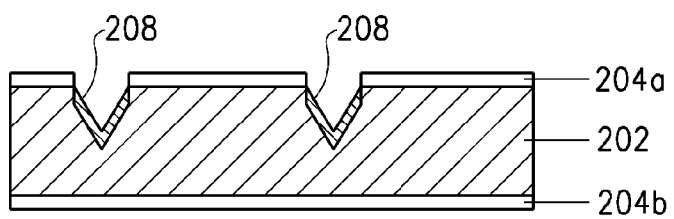
Figure 2E:
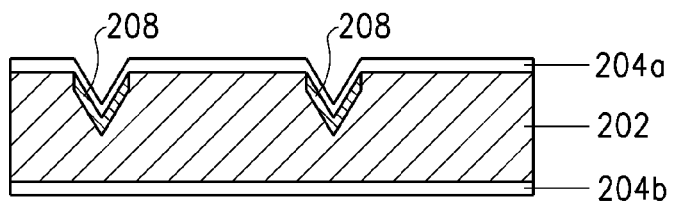

Next, the substrate in which the V grooves 206 have been formed is placed in a diffusion furnace to diffuse the phosphorous. As a result of these steps, an n-layer 208 is formed on the portions of the silicon where the V grooves 206 have been formed as shown in FIG. 2D. In the diffusion furnace, by interrupting the gas serving as the phosphorous material and introducing only oxygen, the surfaces of the V grooves 206 can be covered with an oxide film (FIG. 2E).

Figure 3A:
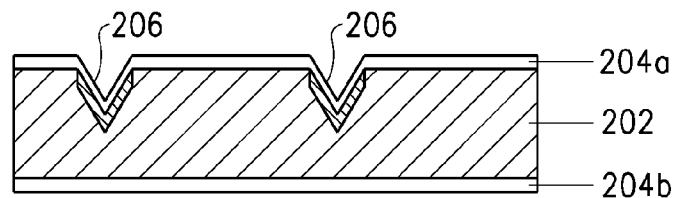
FIG. 3A to 3E are drawings for explaining a production process when producing a solar cell.
Figure 3B:
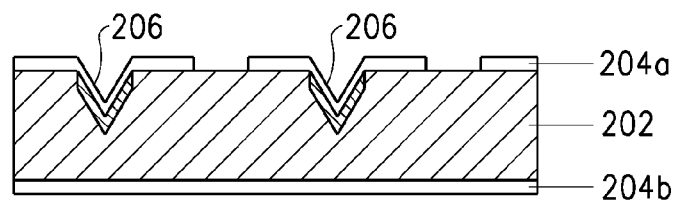

The oxide film is then removed from the substrate obtained in this manner (FIG. 3A) at equal intervals by photolithography or laser etching at the portions between the V grooves 206 of the oxide film 204a (FIG. 3B). For example, in the case the oxide film portion between the V grooves 206 has a width of 300 μm, the oxide film is removed so that the distance from the V grooves 206 on both sides of this oxide film portion is 100 μm.

Figure 3C:
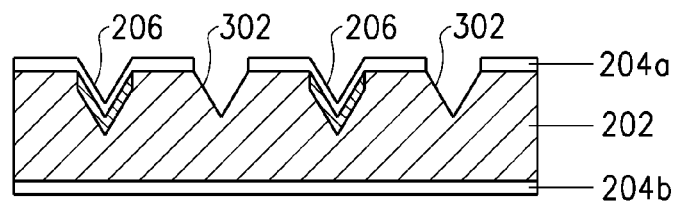

Next, anisotropic etching is carried out with potassium hydroxide (KOH) or tetramethyl ammonium hydroxide (TMAH) and so on at those locations where the oxide film has been removed to form V grooves 302 (at a width of, for example, 100 μm) in the form of stripes having a triangular cross-section (FIG. 3C).

Figure 3D:
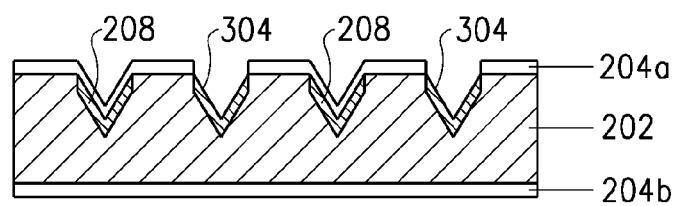
Figure 3E:
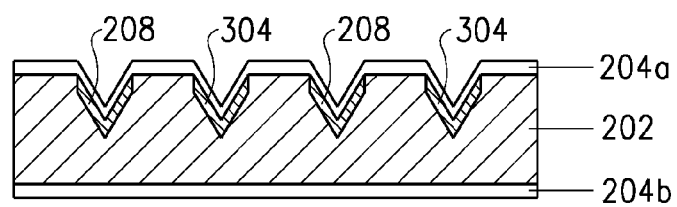

Next, the substrate in which the V grooves 302 have been formed is placed in a diffusion furnace to diffuse the boron. As a result, as shown in FIG. 3D, a p-layer 304 is formed on the silicon portions of the V grooves 302. In the diffusion furnace, by interrupting the gas serving as the boron material and introducing oxygen only, the surfaces of the V grooves 302 can be covered with an oxide film (FIG. 3E).

Figure 4A:
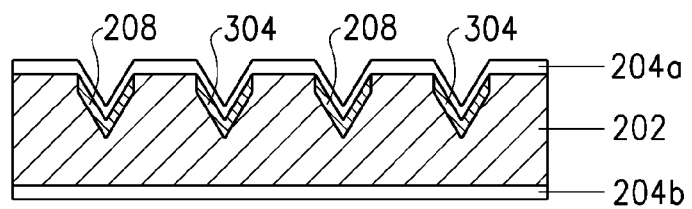
FIG. 4A to 4D are drawings for explaining a production process when producing a solar cell.
Figure 4B:
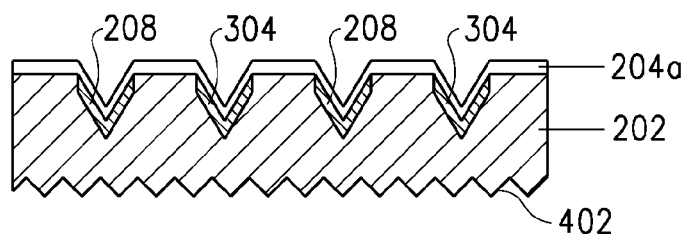
Figure 4C:
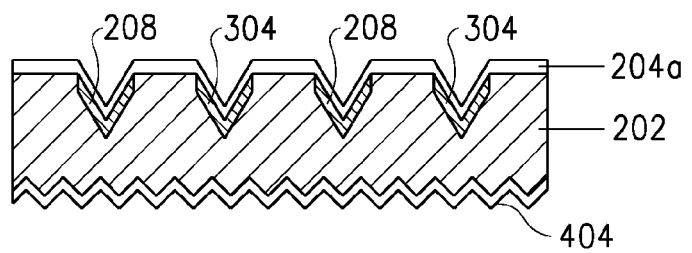

After removing the oxide film on the other surface (the surface on which the oxide film 204b is formed) of the silicon substrate 202 in which two types of V grooves have been formed in this manner (FIG. 4A), anisotropic etching is carried out with potassium hydroxide (KOH) or tetramethyl ammonium hydroxide (TMAH) and so on to form a textured structure 402 in the form of stripes having a triangular cross-section (FIG. 4B). By then carrying out dry oxidation in a diffusion furnace, an oxide film 404 is formed on the other side of the substrate (FIG. 4C).

Figure 4D:
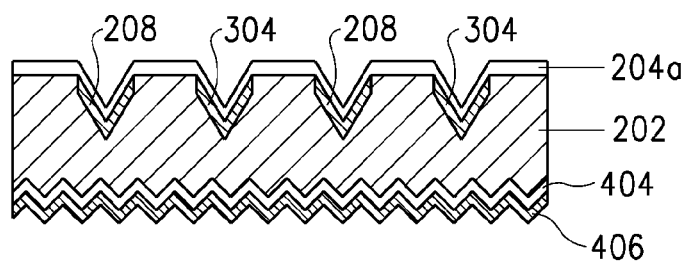
Figure 5A:
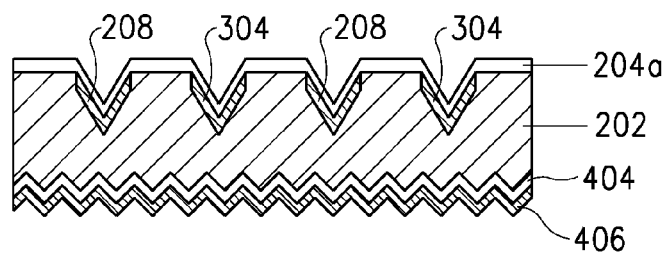
FIG. 5A to 5C are drawings for explaining a production process when producing a solar cell.
Figure 5B:
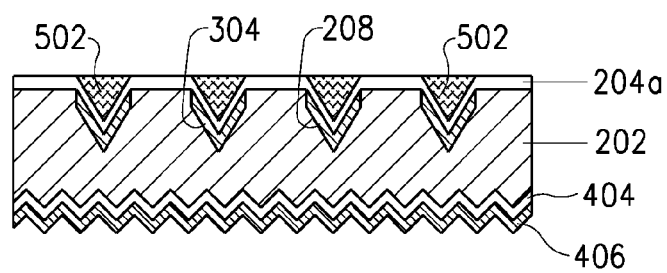
Figure 5C:
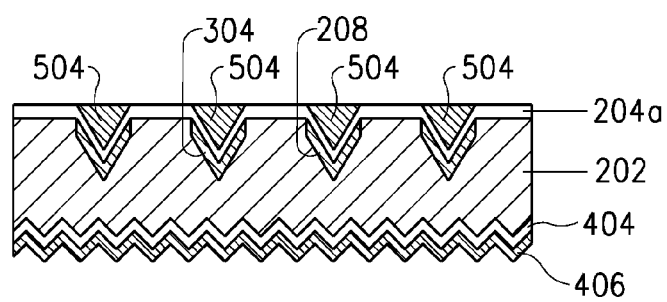

Subsequently, titanium dioxide (TiO2), for example, is then deposited on the side of the oxide film 404 at normal temperatures by sputtering and so on (titanium dioxide film: 406). As a result, a light receiving side having an anti-reflective film with a textured structure is formed on the other side of the substrate (FIG. 4D).

Next, electrodes are formed using the electrically conductive paste (step (1) of the production process of the present invention). In this step, the electrically conductive paste 502 is embedded in the V grooves (FIG. 5B) of the substrate obtained using the method described above (FIG. 5A). Embedding of the electrically conductive paste can be carried out by a patterning method such as screen printing, stencil printing or dispenser applying.

Next, the substrate filled with the electrically conductive paste (FIG. 5A) is fired at a predetermined temperature (for example, 450 to 900° C.) (FIG. 5C) (step (2) of the production process of the present invention). As a result, electrodes 504 are formed.

In the present invention, in the case of an oxide film being formed on the n-layer 208 and the p-layer 304, by firing the electrically conductive paste to fire through the oxide film during formation of the electrodes, the electrode material is coupled directly to the semiconductor and electrical contact is formed.

Back contact-type solar cell electrodes of the present invention are produced according to the process shown in FIG. 2-5.

Manufacture of P-Type Base PV:

In another embodiment of the present invention, the electrode of the present invention can be used in a p-type base solar cell in which a p-type silicon layer is used as the base, and the electrodes are on the light-receiving surfaces of the base, that is, both the surface and reverse side. The following provides an explanation of a silicon type solar cell using the electrode of the present invention and an explanation of a production process of the silicon type solar cell using the example of a solar cell having the structure shown in FIG. 1.

Figure 6A:
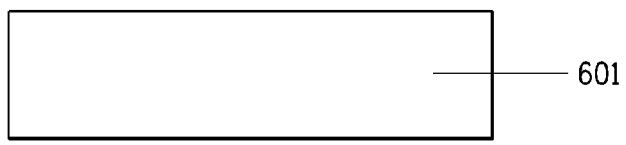
FIG. 6A to 6E are drawings for explaining a P-type base solar cell production process.

FIG. 6A shows a p-type silicon substrate 601.

Figure 6B:
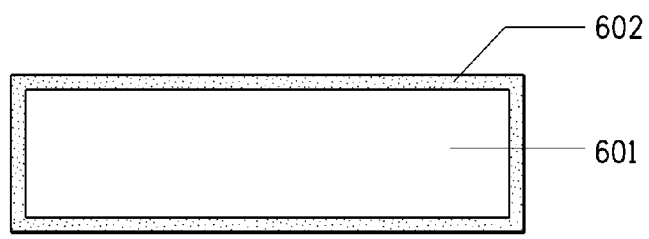
Figure 6C:
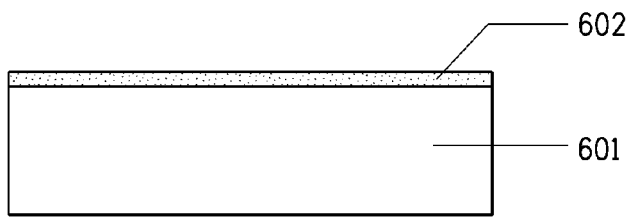
Figure 6D:
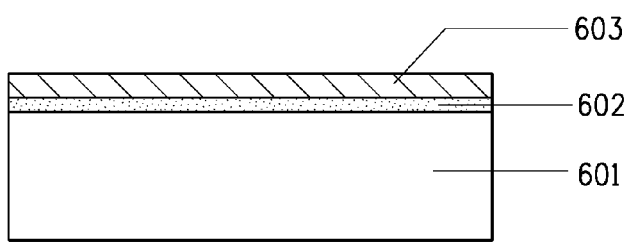
Figure 6E:
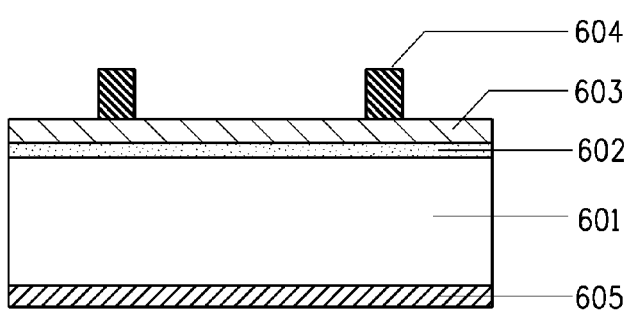

In FIG. 6B, an n-layer 602, of the reverse conductivity type is formed by the thermal diffusion of phosphorus (P) or the like. Phosphorus oxychloride ($POCl_3$) is commonly used as the phosphorus diffusion source. In the absence of any particular modification, n-layer 602 is formed over the entire surface of the silicon substrate 601. The silicon wafer consists of p-type substrate 601 and n-layer 602 typically has a sheet resistivity on the order of several tens of ohms per square) ($\Omega/°$). After protecting one surface of the n-layer with a resist or the like, the n-layer 602 is removed from most surfaces by etching so that it remains only on one main surface as shown in FIG. 6C. The resist is then removed using an organic solvent or the like. Next, an anti-reflection coating 603 is formed on the n-layer 602 as shown in FIG. 6D by a process such as plasma chemical vapor deposition (CVD). As shown in FIG. 6E, conductive paste for the front electrode 604 is screen printed then dried over the silicon nitride film which is the anti-reflection coating 603. The present invention may be applied to the front electrode 604. The conductive paste is then screen printed to form a backside electrode 605 and successively dried on the backside of the substrate 601. The present invention may be applied to the backside electrode 605 as well as to the front electrode. The back side conductive layers may be two layers which comprise different metal respectively. Firing is then carried out in an infrared furnace at a temperature range of approximately 450° C. to 900° C. for a period of from several minutes to several tens of minutes.

Figure 7A:
FIG. 7A to 7E are drawings for explaining an N-type base solar cell production process.
Figure 7B:
Figure 7C:
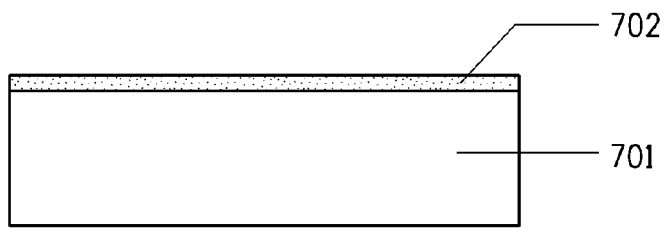
Figure 7D:
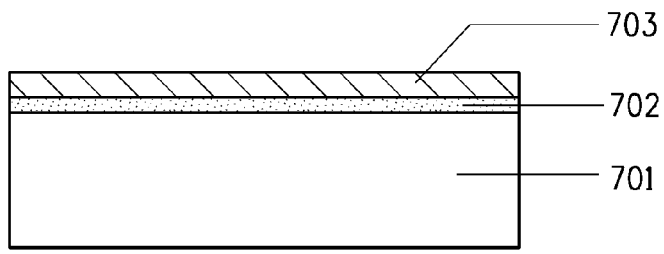
Figure 7E:
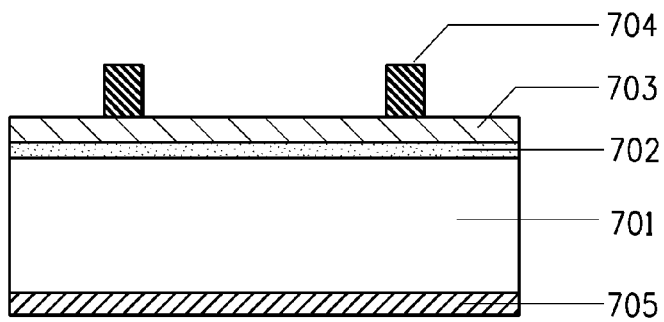

Manufacture of n-type base PV: In another embodiment of the present invention, the electrode of the invention can be used in an n-type base solar cell in which an n-type silicon layer is used as the base, and there are electrodes on the light-receiving surface of the base, that is, front side and the reverse side of the base, that is, back side. FIG. 7A shows an n-type silicon substrate 701. In FIG. 7B, the p-layer 702 of the reverse conductivity type is formed by the thermal diffusion of boron (B) or the like. Boron tribromide ($BBr_3$) is commonly used as the boron diffusion source. In the absence of any particular modification, the p-layer 702 is formed over the entire surface of the n-type silicon substrate 701. The silicone wafer consists of n-type substrate 701 and p-layer 702 typically has a sheet resistivity on the order of several tens of ohms per square ($\Omega/°$ C.). After protecting one surface of the p-layer with a resist or the like, the p-layer 702 is removed from most surfaces by etching so that it remains only on one main surface as shown in FIG. 7C. The resist is then removed using an organic solvent or the like. Next, an anti-reflection coating 703 is formed on the p-layer 702 as shown in FIG. 7D by a process such as plasma chemical vapor deposition (CVD). As shown in FIG. 7E, a conductive paste for the front electrode 704 is screen printed over the silicon nitride film 703. The present invention may be applied to the front electrode 704. In addition, a conductive paste is also then screen printed and successively dried on the backside of the n-type silicon substrate 701. The present invention may be applied to the backside electrode 705 as well as to the front electrode. The conductive layer may be two layers which comprise different metal respectively. Firing is then carried out in an infrared furnace at a temperature range of approximately 450° C. to 900° C. for a period of from several minutes to several tens of minutes.

Both of p-type base and n-type base solar cell, When a semiconductor, for example, is used as a photocatalyst and light having energy greater than the band gap energy of the semiconductor is irradiated, electrons in the valence band are photo-excited into the conduction band to generate free electrons in the conduction band, and, in contrast, positive holes are generated in the valence band. The more electrons reach to the electrode before recombination of those free electrons and positive holes called carrier, the more electric current is obtained. Therefore, recombination reduction is effective in raising solar cell's efficiency.

EXAMPLES

The present invention is illustrated by, but is not limited to, the following examples.

(I) Conductive Paste Materials

The conductive paste was produced using the following materials.

(i) Conductive Powder

Silver particle: Flake powder [D50 2.7 μm as determined with a laser scattering-type particle size distribution measuring apparatus]

titanium particle amorphous powder [D50 27 μm as determined with a laser scattering-type particle size distribution measuring apparatus](TIE06PB, purity 99.9%, Kojundo Chemical Laboratory Co., Ltd.)

Palladium particle spherical powder [D50 0.8 μm as determined with a laser scattering-type particle size distribution measuring apparatus]

(ii) Glass frit: borosilicate lead glass (Softening point: 440° C.)

(iii) Resin binder: Ethyl cellulose (iv) Solvent: Terpineol (II) Production of Conductive Paste Ethyl cellulose resin and terpineol were mixed, heated, and dissolved, and the mixture was then cooled to room temperature, giving a terpineol solution with a resin concentration of 16 wt %. 68.0 wt % silver particle powder, 7.0 wt % glass frit, and 25.0 wt % terpineol solution were weighed and mixed in the following proportions, and the mixture was processed with 3-roll mill, giving an Ag paste. 65.3 wt % silver powder, 2.7 wt % palladium powder, 7.0 wt % glass frit, and 25.0 wt % terpineol solution were then similarly used as materials to produce paste of an Ag—Pd mixture. 50.0 wt % Ti particles and 50.0 wt % terpineol solution were also weighed out and mixed, and the mixture was processed for 2 min in a rotary type of mixer that is well known per se, giving a Ti paste. The resulting Ag paste, Ag—Pd paste, and Ti paste were mixed in the proportions given in Table 1, and the mixture was processed for 30 sec in a rotary type of mixer. Conductive paste composition 1-11 comprises varying Ag paste, Pd paste, and Ti paste contents are shown in the Table 1. The wt % of the Ag particles, Ti particles, and Pd particles are shown in Table 2 relative to the total weight of the conductive powder in each paste.

TABLE 1

| Paste number | Ag paste (wt %) | Ag—Pd paste (wt %) | Ti paste (wt %) |
|---|---|---|---|
| 1 | 100.0 | 0.0 | 0.0 |
| 2 | 0.0 | 100.0 | 0.0 |
| 3 | 97.3 | 0.0 | 2.7 |
| 4 | 94.6 | 0.0 | 5.4 |
| 5 | 89.4 | 0.0 | 10.6 |
| 6 | 79.4 | 0.0 | 20.6 |
| 7 | 0.0 | 94.6 | 5.4 |
| 8 | 0.0 | 89.4 | 10.6 |
| 9 | 0.0 | 79.4 | 20.6 |
| 10 | 0.0 | 61.0 | 39.0 |
| 11 | 0.0 | 29.3 | 70.7 |

(III) Manufacture of Test Pieces

Figure 8A:
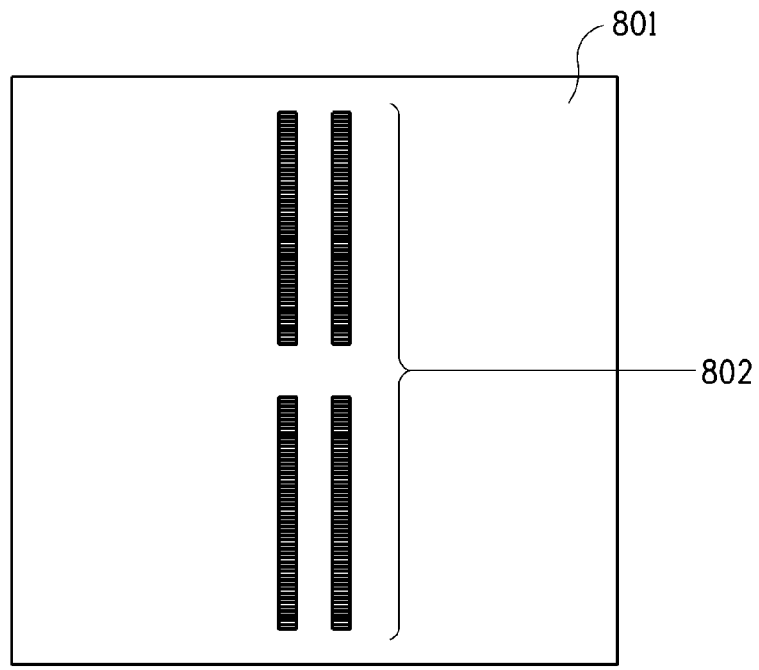

The conductive pastes obtained by the above method were screen printed, with 1 mm intervals between the electrodes (10 mm long, 1 mm wide, 20 μm thick) 802, on N-base type and P-base type Si wafers (25 mm×25 mm) 801 (FIG. 8A). That is, the conductive paste was printed onto the p-layer in n-type base Si wafers, and onto the n-layer in p-type base Si wafers. The conductive pastes printed onto the wafers were dried at 150° C. for 5 min in a convection oven. Electrodes were then obtained upon being sintered at varying temperature settings (650° C., 700° C., and 725° C.) in an IR heating type of belt furnace. The belt speed during sintering was 370 cpm.

(IV) Measurement of Resistance

Figure 8B:
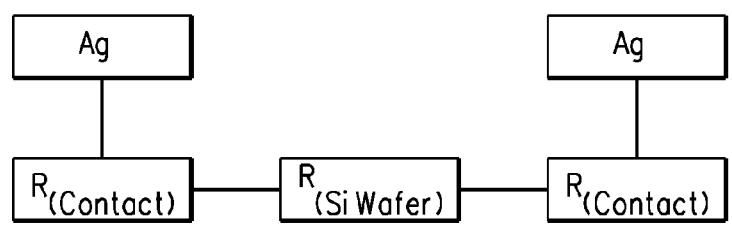
FIG. 8B is a drawing for explaining resistance values measured between electrodes.

The resistance between the electrodes (resistance between pads, Ω) was measured using a source meter (2420, Keithley Instruments Inc.). As shown in FIG. 8B, the measured resistance between pads was the sum of the Si wafer resistance, the resistance of the electrode itself and contact resistance at the interface between the Si wafer and electrode. The electrode resistance is extremely relatively low compare with other resistance. The Resistance of Si wafer is the almost same between samples. Because the same Si wafers were used, the resistance between the pads all had the same Si wafer resistance. The inherent resistance of electrodes is relatively low, as is generally known. The magnitude of the resistance between pads thus represents, that is, the magnitude of the contact resistance.

(V) Results

Table 2 shows the measured results for the resistance between pads of the electrodes formed using the various conductive pastes. The resistance between pads of the electrodes formed using conductive pastes 7-11 was no more than 2.0 ohm on the n-layer and no more than 20 ohm on the p-layer, regardless of sintering temperature. That is, the resistance between pads could be kept low, regardless of sintering temperature, even when the paste containing silver, titanium, and palladium was formed on both the n-layer and p-layer.

TABLE 2

| Paste number | N/P | Conductive powder (wt %) | | | Resistance between Pads (ohm) Firing temperature | | |
|---|---|---|---|---|---|---|---|
| | | Ag | Ti | Pd | 650 C. | 700 C. | 725 C. |
| 1 | N | 100.0 | 0.0 | 0.0 | 200.9 | 59.9 | — |
| 2 | N | 96.0 | 0.0 | 4.0 | 1.0 | 1.5 | 2.3 |
| 3 | N | 98.0 | 2.0 | 0.0 | 2.6 | 2.3 | 2.3 |
| 4 | N | 96.0 | 4.0 | 0.0 | 2.2 | 1.8 | 1.9 |
| 5 | N | 92.0 | 8.0 | 0.0 | 1.7 | 1.5 | 1.7 |
| 6 | N | 84.0 | 16.0 | 0.0 | 1.4 | 1.4 | 1.5 |
| 7 | N | 92.2 | 4.0 | 3.8 | 0.9 | 1.3 | 1.7 |
| 8 | N | 88.3 | 8.0 | 3.7 | 1.0 | 1.1 | 1.3 |
| 9 | N | 80.7 | 16.0 | 3.3 | 1.0 | 1.1 | 1.4 |
| 10 | N | 65.3 | 32.0 | 2.7 | 1.0 | 1.1 | 1.1 |
| 11 | N | 34.6 | 64.0 | 1.4 | 1.3 | 1.4 | 1.6 |
| 1 | P | 100.0 | 0.0 | 0.0 | 277.7 | 5626.8 | — |
| 2 | P | 96.0 | 0.0 | 4.0 | 13.6 | 16.6 | 20.8 |
| 3 | P | 98.0 | 2.0 | 0.0 | 61.8 | 26.4 | 24.1 |
| 4 | P | 96.0 | 4.0 | 0.0 | 39.6 | 19.3 | 22.1 |
| 5 | P | 92.0 | 8.0 | 0.0 | 24.9 | 16.6 | 17.0 |
| 6 | P | 84.0 | 16.0 | 0.0 | 27.5 | 14.8 | 15.7 |
| 7 | P | 92.2 | 4.0 | 3.8 | 12.8 | 15.3 | 18.2 |
| 8 | P | 88.3 | 8.0 | 3.7 | 13.0 | 16.6 | 16.2 |
| 9 | P | 80.7 | 16.0 | 3.3 | 12.5 | 13.7 | 14.2 |
| 10 | P | 65.3 | 32.0 | 2.7 | 12.1 | 13.1 | 14.3 |
| 11 | P | 34.6 | 64.0 | 1.4 | 13.8 | 14.9 | 16.6 |

(VI) Use of $TiH_2$

Pastes 12-19 were then prepared in the same manner as above except that the titanium particles were changed to titanium hydroxide ($TiH_2$) particles (TII04PB, Kojundo Chemical Laboratory Co., Inc.) in the composition used for pastes 4-10 containing silver, titanium, and palladium. The content of the silver, titanium, and palladium included in the pastes is shown in Table 3. The mean particle diameter (D50) of the $TiH_2$ that was used was 5-10 um. The resistance between pads obtained using these pastes 12-19 was measured in the same manner as above (Table 3).

The resistance between pads of the electrodes formed using conductive pastes 12-19 was no more than 2.0 ohm on the n-layer and no more than 20.0 ohm on the p-layer, regardless of sintering temperature. That is, the resistance between pads could be kept low, regardless of sintering temperature, even when a paste containing 65.3 to 92.2 wt % silver, 4 to 32 wt % $TiH_2$, and 2.7 to 3.8 wt % palladium was formed on both the n-layer and p-layer.

TABLE 3

| Paste number | N/P | Conductive powder (wt %) | | | Resistance between Pads (ohm) Firing temperature | | |
|---|---|---|---|---|---|---|---|
| | | Ag | $TiH_2$ | Pd | 650 C. | 700 C. | 725 C. |
| 12 | N | 96.0 | 4.0 | 0.0 | 131.0 | 163.5 | 44.6 |
| 13 | N | 92.0 | 8.0 | 0.0 | 115.7 | 63.2 | 57.8 |
| 14 | N | 84.0 | 16.0 | 0.0 | 44.4 | 28.4 | 38.7 |
| 15 | N | 68.0 | 32.0 | 0.0 | 17.1 | 19.6 | 15.4 |
| 16 | N | 92.2 | 4.0 | 3.8 | 1.0 | 1.1 | 1.3 |
| 17 | N | 88.3 | 8.0 | 3.7 | 0.9 | 1.1 | 1.3 |
| 18 | N | 80.7 | 16.0 | 3.3 | 0.9 | 1.1 | 1.4 |
| 19 | N | 65.3 | 32.0 | 2.7 | 0.9 | 1.1 | 1.1 |
| 12 | P | 96.0 | 4.0 | 0.0 | 1570.9 | 2148.8 | 825.2 |
| 13 | P | 92.0 | 8.0 | 0.0 | 1104.9 | 382.7 | 310.3 |
| 14 | P | 84.0 | 16.0 | 0.0 | 383.3 | 243.7 | 188.1 |
| 15 | P | 68.0 | 32.0 | 0.0 | 102.1 | 105.9 | 140.5 |
| 16 | P | 92.2 | 4.0 | 3.8 | 14.0 | 15.5 | 19.6 |
| 17 | P | 88.3 | 8.0 | 3.7 | 13.8 | 14.8 | 16.2 |
| 18 | P | 80.7 | 16.0 | 3.3 | 12.5 | 14.2 | 13.5 |
| 19 | P | 65.3 | 32.0 | 2.7 | 11.4 | 11.4 | 12.5 |

In the past, a conductive paste having low resistance between pads was present on the n-layer, but the electrode of the present invention results in low resistance between pads when used on both the n-layer and p-layer. There is thus no need to use different conductive pastes depending on the type of base, making the invention ideal for use in back contact types of solar cells having both an n-layer and p-layer on one side. Furthermore, because the resistance will not increase, even when sintered at elevated temperatures, it is possible to keep the resistance low without adjusting the sintering temperature. That is, it was necessary to set the sintering temperature in conformity with the conductive paste in the past, but when the conductive paste of the present invention is used, the range of sintering temperatures that can be set is greater, thus allowing electrodes with low resistance to be consistently formed in solar cells.

What is claimed is:

1. A solar cell electrode formed by sintering a conductive paste comprising: (a) a conductive powder, (b) glass frit, and (c) a resin binder, wherein the conductive powder contains 30 to 98 wt % silver particles, 1 to 70 wt % Ti particles or TiH2 particles, and 1 to 10 wt % (i) metal particles selected from the group consisting of Zr, Cr, Co, Mo, Tc, Ru, Rh, Pd, W, Re, Os, Ir, and Pt, (ii) alloy particles including said metals, or (iii) support particles supporting said metal particles.

2. A method for producing a solar cell electrode comprising: a step of applying onto a silicon substrate a conductive paste for a solar cell electrode containing: (a) a conductive powder, (b) glass frit, and (c) a resin binder; and a step of sintering the conductive paste that has been applied, wherein the conductive powder contains 30 to 98 wt % silver particles, 1 to 70 wt % Ti particles or TiH2 particles, and 1 to 10 wt % (i) metal particles selected from the group consisting of Zr, Cr, Co, Mo, Tc, Ru, Rh, Pd, W, Re, Os, Ir and Pt, (ii) alloy particles including said metals, or (iii) additive particles selected from particles supporting said metal particles.

3. The method for producing a solar cell electrode according to claim 2, wherein the paste is sintered at 450 to 900 degrees Celsius.

4. A method for producing a solar cell electrode, the method comprising: applying and sintering on both the n-layer and p-layer of a silicon substrate a conductive paste for a solar cell electrode containing (a) a conductive powder, (b) glass frit, and (c) a resin binder, wherein the conductive powder contains 30 to 98 wt % silver particles, 1 to 70 wt % Ti particles or TiH2 particles, and 1 to 10 wt % (i) metal particles selected from the group consisting of Zr, Cr, Co, Mo, Tc, Ru, Rh, Pd, W, Re, Os, Ir and Pt, (ii) alloy particles including said metals, or (iii) additive particles selected from particles supporting said metal particles.

* * * * *